(12) United States Patent
Kim et al.

(10) Patent No.: US 12,334,248 B2
(45) Date of Patent: Jun. 17, 2025

(54) SLIM-TYPE MAGNETIC COMPONENT

(71) Applicant: LG INNOTEK CO., LTD., Seoul (KR)

(72) Inventors: Bi Yi Kim, Seoul (KR); Yong Hwan Kim, Seoul (KR); Sue Kyung Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 241 days.

(21) Appl. No.: 17/936,209

(22) Filed: Sep. 28, 2022

(65) Prior Publication Data

US 2023/0101943 A1    Mar. 30, 2023

(30) Foreign Application Priority Data

Sep. 28, 2021    (KR) .......................... 10-2021-0128182

(51) Int. Cl.
*H01F 27/29* (2006.01)
*H01F 27/24* (2006.01)
(Continued)

(52) U.S. Cl.
CPC ........... *H01F 27/292* (2013.01); *H01F 27/24* (2013.01); *H01F 27/325* (2013.01); *H05K 1/181* (2013.01); *H05K 2201/1003* (2013.01)

(58) Field of Classification Search
CPC ........ H01F 27/29; H01F 27/292; H01F 27/24; H01F 27/325; H05K 1/181; H05K 2201/1003
(Continued)

(56) References Cited

U.S. PATENT DOCUMENTS

2011/0043315 A1    2/2011    Kobayashi et al.
2017/0032888 A1    2/2017    Park et al.

FOREIGN PATENT DOCUMENTS

GB    2568497 A    5/2019
JP    2013-58528 A    3/2013
(Continued)

OTHER PUBLICATIONS

European Search Report dated Feb. 3, 2023 in European Application No. 22198349.7.
(Continued)

*Primary Examiner* — Tremesha W Burns
(74) *Attorney, Agent, or Firm* — Saliwanchik, Lloyd & Eisenschenk

(57) ABSTRACT

Disclosed is a magnetic component. The magnetic component of the disclosure includes a core unit including an upper core and a lower core, a bobbin unit having at least a portion disposed inside the core unit, and a coil unit including primary coils and secondary coils wound around the bobbin unit in a second direction, which is perpendicular to a first direction oriented from the upper core toward the lower core. The bobbin unit includes a first terminal accommodation portion and a second terminal accommodation portion. The first terminal accommodation portion accommodates first terminal pins, connected to at least some of the secondary coils in the second direction and having end portions bent in the first direction. The second terminal accommodation portion accommodates second terminal pins, connected to the remaining ones of the secondary coils in the second direction and having end portions bent in the first direction.

16 Claims, 6 Drawing Sheets

(51) Int. Cl.
 *H01F 27/32* (2006.01)
 *H05K 1/18* (2006.01)
(58) Field of Classification Search
 USPC .......................................................... 174/260
 See application file for complete search history.

(56) References Cited

FOREIGN PATENT DOCUMENTS

| | | | |
|---|---|---|---|
| JP | 2017-212355 | A | 11/2017 |
| JP | 2018-74096 | A | 5/2018 |
| JP | 2020-107856 | A | 7/2020 |
| KR | 1998-027843 | U | 8/1998 |
| KR | 20-0203634 | Y1 | 11/2000 |
| KR | 20-0273958 | Y1 | 9/2002 |
| KR | 10-1686975 | B1 | 1/2017 |
| KR | 10-1858117 | B1 | 5/2018 |
| KR | 10-2018-0092807 | A | 8/2018 |

OTHER PUBLICATIONS

Notice of Allowance dated Mar. 27, 2025 in Korean Application No. 10-2024-0027470.

| NO | Terminal | | NO | Terminal | | NO | Terminal | |
|---|---|---|---|---|---|---|---|---|
| | S | F | | S | F | | S | F |
| NP1 | 2 | 3 | NS1 | 6 | 9 | NS3 | 5 | 10 |
| NP2 | 1 | 4 | NS2 | 8 | 11 | NS4 | 7 | 12 |

NP : Primary Coil, NS : Secondary Coil     S : Start, F : Finish

SLIM-TYPE MAGNETIC COMPONENT

CROSS REFERENCE TO RELATED APPLICATION

This application claims priority under 35 U.S.C. § 119 from Korean Patent Application No. 10-2021-0128182, filed in Korea on Sep. 28, 2021, which is hereby incorporated in its entirety by reference as if fully set forth herein.

TECHNICAL FIELD

Embodiments relate to a slim-type magnetic component.

BACKGROUND

Magnetic components are used for power supply devices of electronic apparatuses, such as TVs, and meanwhile, the demand for slim electronic apparatuses, such as TVs, is accelerating. Because electronic apparatuses are produced in slim form factors, there is a large demand for slim-type magnetic components. Particularly, technical competition to produce a slim-type magnetic component having a size of 15 mm or less has intensified.

As one example of magnetic components, a transformer is generally configured such that terminal pins are mounted to both sides of a bobbin unit, primary coils are connected to the terminal pins mounted to one side of the bobbin unit, and secondary coils are connected to the terminal pins mounted to the opposite side of the bobbin unit.

As one example of transformers, there is a multi-transformer (a multi-winding transformer), which is a multi-output transformer configured to convert power input thereto so as to simultaneously output various magnitudes of voltage/current. However, the multi-transformer has a problem in that interference or a short between secondary coils occurs easily due to the reduced size thereof.

Particularly, in the conventional art, terminal pins, to which secondary coils are connected, are arranged in a single layer, and an end portion of each of the coils is withdrawn out of a coil-winding portion and is electrically connected to a corresponding one of the terminal pins through soldering or the like. In this case, when end portions of the secondary coils, between which a short should not occur, are connected to respective terminal pins while intersecting each other, the end portions of the secondary coils may interfere with each other, and a short may occur therebetween through portions covered by damaged sheaths during a soldering process.

In order to solve the above problems with the coils, there may be considered a structure in which a protrusion is formed above a terminal pin so as to be spaced a predetermined distance apart from the terminal pin and in which a coil extension portion extending from a coil-winding portion to the terminal pin is wound around the protrusion, thereby inhibiting interference or a short between coil extension portions. In this case, however, it is not possible to use automatic winding equipment when winding the end portion of the coil around the protrusion. Therefore, process lead time and production costs increase. In addition, quality uniformity is deteriorated, and production yield decreases. In addition, loss of materials increases, and thus material costs increase.

SUMMARY

Embodiments provide a slim-type magnetic component capable of solving at least one of the above-mentioned problems.

Embodiments provide a slim-type magnetic component capable of inhibiting interference or a short between a plurality of coils when the coils are connected to respective terminal pins, minimizing the size thereof, and enabling automated winding using automatic winding equipment.

In one embodiment, a magnetic component includes a core unit including an upper core and a lower core, a bobbin unit having at least a portion disposed inside the core unit, and a coil unit including primary coils and secondary coils wound around the bobbin unit in a second direction, which is perpendicular to a first direction oriented from the upper core toward the lower core. The bobbin unit includes a first terminal accommodation portion and a second terminal accommodation portion formed in one side thereof to accommodate terminal pin portions including first terminal pins and second terminal pins. The first terminal accommodation portion accommodates the first terminal pins, connected to at least some of the secondary coils in the second direction and having end portions bent in the first direction. The second terminal accommodation portion accommodates the second terminal pins, connected to the remaining ones of the secondary coils in the second direction and having end portions bent in the first direction. The first terminal accommodation portion and the second terminal accommodation portion are spaced apart from each other in the first direction.

In at least one embodiment of the present disclosure, the first terminal pins and the second terminal pins may be disposed so as not to overlap each other in the first direction.

In at least one embodiment of the present disclosure, the secondary coils may include a first turn and a second turn. Each of the first turn and the second turn may include a winding portion wound around the bobbin unit and two extension portions extending from the winding portion toward the terminal pin portions. One of the extension portions of the first turn and one of the extension portions of the second turn may be electrically connected to each other. The extension portion of the first turn and the extension portion of the second turn, which are electrically connected to each other, may be disposed in the first terminal accommodation portion.

In at least one embodiment of the present disclosure, the remaining one of the extension portions of the first turn and the remaining one of the extension portions of the second turn may be electrically separated from each other. The extension portion of the first turn and the extension portion of the second turn, which are electrically separated from each other, may be respectively disposed in the first terminal accommodation portion and the second terminal accommodation portion.

In at least one embodiment of the present disclosure, the primary coils may be connected to terminal pins formed on the other side opposite the one side of the bobbin unit.

In at least one embodiment of the present disclosure, the first terminal accommodation portion and the second terminal accommodation portion may be disposed parallel to each other in the first direction.

In at least one embodiment of the present disclosure, among the end portions of the first terminal pins and the end portions of the second terminal pins, which are bent in the first direction, the end portion having the lowest height may be 85% to 99% of the height of the end portion having the highest height.

In at least one embodiment of the present disclosure, the magnetic component may further include an insulative reinforcement portion disposed at the bobbin unit or around the coil unit.

Here, the insulative reinforcement portion may include at least one of epoxy resin or silicon resin.

In at least one embodiment of the present disclosure, the bobbin unit may have a through-hole formed in the center thereof. The core unit may include at least one intermediate leg passing through the through-hole and at least one pair of outer legs disposed at both sides of the bobbin unit.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
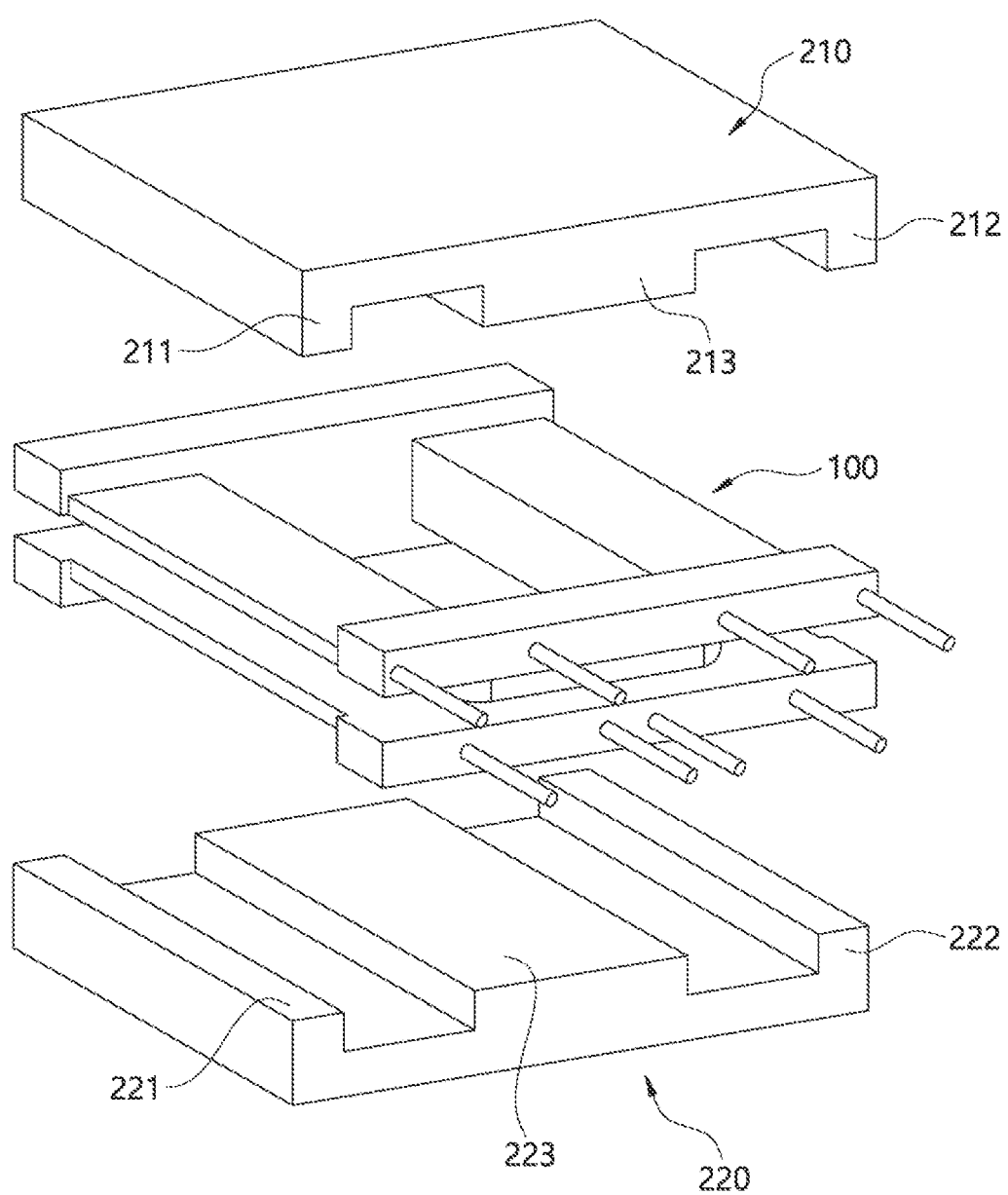
FIG. 1 is an exploded perspective view of a magnetic component according to an embodiment of the present disclosure.

The present disclosure will now be described more fully hereinafter with reference to the accompanying drawings, in which various embodiments are shown. The examples, however, may be embodied in many different forms and should not be construed as being limited to the embodiments set forth herein. It is to be understood that the present disclosure covers all modifications, equivalents, and alternatives falling within the scope and spirit of the present disclosure.

The terms "module" and "unit", with which the names of components are suffixed, are assigned or used only in consideration of preparation of the specification, and may be interchanged with each other. The terms do not have any distinguishable meanings or roles.

While ordinal numbers including "first", "second", etc. may be used to describe various components, they are not intended to limit the components. These expressions are used only to distinguish one component from another component.

As used herein, the term "and/or" includes any and all combinations of one or more of the associated listed items. For example, the phrase "A and/or B" means "(A), (B), or (A and B)".

It will be understood that when an element is referred to as being "connected" or "coupled" to another element, it can be directly connected or coupled to the other element, or intervening elements may be present.

In the description of the embodiments, it will be understood that when an element, such as a layer (film), a region, a pattern or a structure, is referred to as being "on" or "under" another element, such as a substrate, a layer (film), a region, a pad or a pattern, the term "on" or "under" means that the element is "directly" on or under another element or is "indirectly" formed such that an intervening element may also be present. In addition, it will also be understood that criteria of on or under is on the basis of the drawing. For example, the phrase "B on" merely indicates that B is illustrated in the drawing as being located on A, unless otherwise defined or unless A must be located on B due to the characteristics of A or B. In an actual product, B may be located under A, or B and A may be disposed in a leftward-rightward direction.

The thickness or size of a layer (film), a region, a pattern, or a structure shown in the drawings may be exaggerated, omitted or schematically drawn for the convenience and clarity of explanation, and may not accurately reflect the actual size.

The terminology used herein is for the purpose of describing particular embodiments only and is not intended to be limiting of exemplary embodiments of the disclosure. As used herein, the singular forms "a", "an", and "the", are intended to include the plural forms as well, unless the context clearly indicates otherwise. It will be further understood that the terms "comprises", "comprising", "includes", and/or "including", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein, which include technical or scientific terms, have the same meanings as those generally appreciated by those skilled in the art. The terms, such as ones defined in common dictionaries, should be interpreted as having the same meanings as terms in the context of pertinent technology, and should not be interpreted as having ideal or excessively formal meanings unless clearly defined in the specification.

Hereinafter, an embodiment of the present disclosure will be described in detail with reference to FIGS. 1 to 6.

Figure 2:
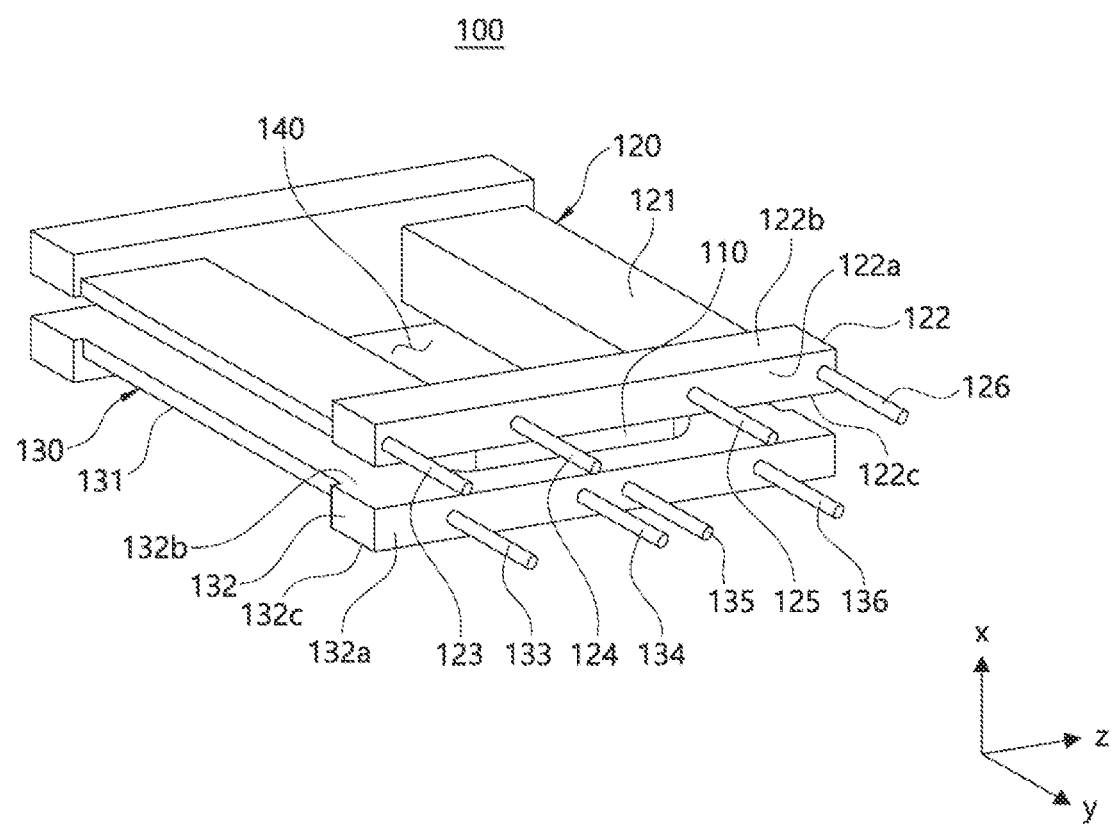
FIG. 2 illustrates the bobbin unit and the coil assembly shown in FIG. 1.
Figure 3:
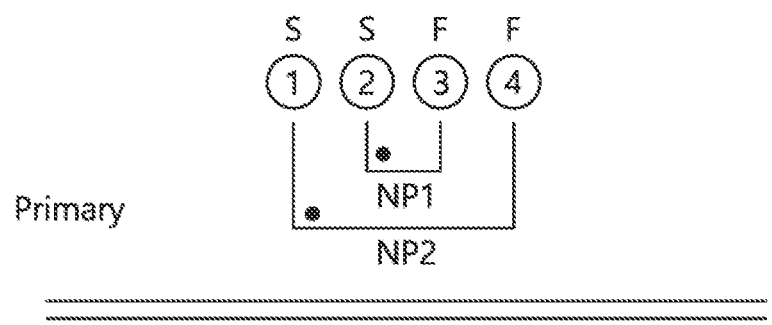
FIG. 3 illustrates a pin map of the magnetic component shown in FIG. 1.
Figure 3:
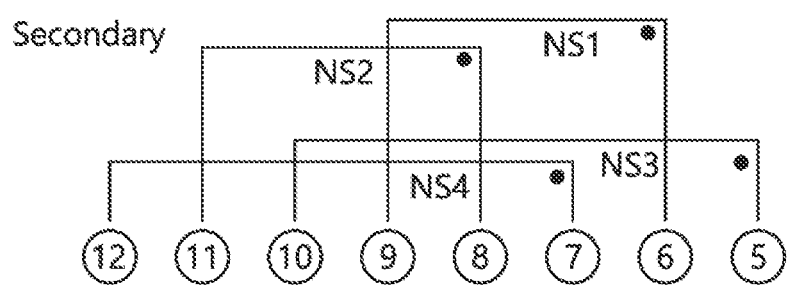
Figure 4:
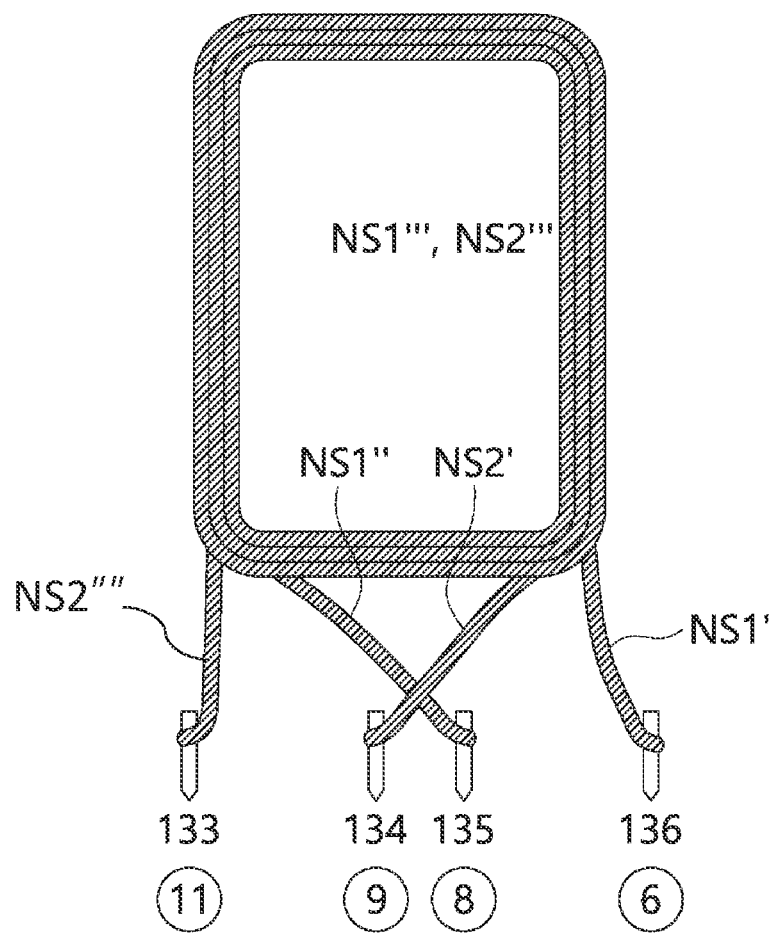
FIG. 4 illustrates a structure in which a pair of secondary coils is connected to respective terminal pins.
Figure 5:
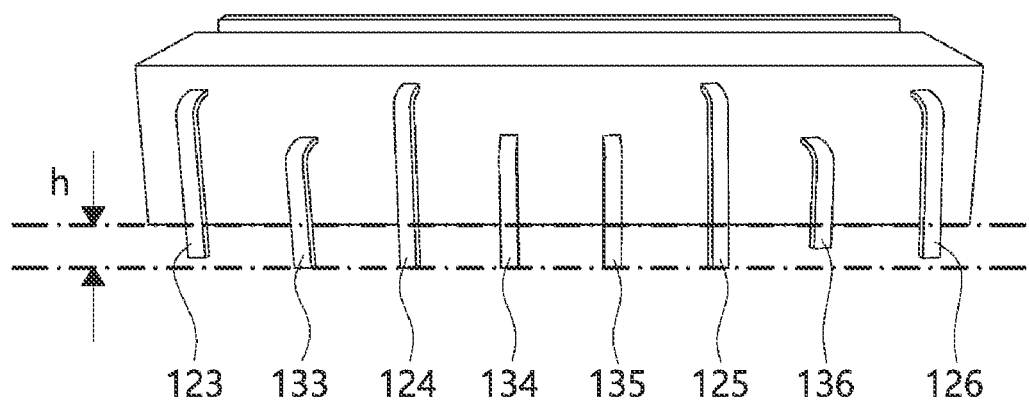
FIG. 5 illustrates terminal pins of a final product of the magnetic component shown in FIG. 1.
Figure 6:
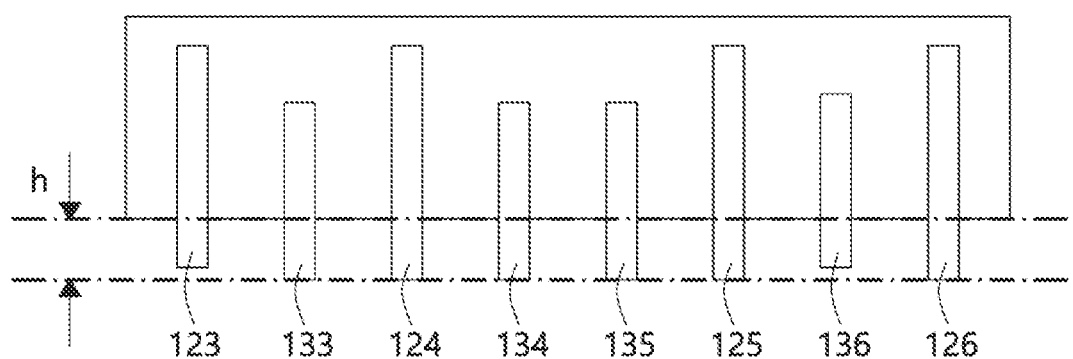
FIG. 6 illustrates a front view of terminal pins of a final product of the magnetic component shown in FIG. 5.

FIG. 1 is an exploded perspective view of a magnetic component according to an embodiment of the present disclosure. FIG. 2 illustrates the bobbin unit and the coil assembly shown in FIG. 1. FIG. 3 illustrates a pin map of the magnetic component shown in FIG. 1. FIG. 4 illustrates a structure in which a first secondary coil and a second secondary coil are electrically connected to respective terminal pins. FIG. 5 illustrates terminal pins of a final product of the magnetic component shown in FIG. 1. FIG. 6 illustrates a front view of terminal pins of a final product of the magnetic component shown in FIG. 5.

The magnetic component of the embodiment is a multi-transformer, but the disclosure is not limited thereto.

The transformer of the embodiment includes a bobbin unit 100, a coil unit (Not shown) wound around the bobbin unit 100, and cores 210 and 220. The coil unit (Not shown) includes two primary coils NP1 and NP2 and four secondary coils NS1, NS2, NS3, and NS4.

The cores 210 and 220 are EE cores 210 and 220, and include an upper core 210 and a lower core 220, which have the same shape and structure.

The upper core 210 includes a rectangular-shaped flat plate, a pair of outer legs 211 and 212 protruding from the left and right sides of the flat plate, and an intermediate leg 213 disposed between the outer legs 211 and 212.

Similarly, the lower core 220 includes a rectangular-shaped flat plate, a pair of outer legs 221 and 222 protruding from the flat plate, and an intermediate leg 223.

A portion of the bobbin unit 100 is interposed between the upper core 210 and the lower core 220, and is assembled to the upper core 210 and the lower core 220 so as to be disposed inside the cores 210 and 220.

The bobbin unit 100 has a through-hole 140 formed therein. The bobbin unit 100 includes a wound portion 110, around which the coils are wound, and a pair of flange portions 120 and 130, which are disposed on both sides of the wound portion 110 in an X-axis direction. Based on FIG. 2, an upper flange portion 120 is located above the wound portion 110, and a lower flange portion 130 is located below the wound portion 110.

The upper flange portion 120 includes a middle portion 121, which is connected to the wound portion 110, and a first terminal accommodation portion 122, which is formed on one side of the middle portion 121 in a direction perpendicular to the X-axis direction (a Y-axis direction). The first terminal accommodation portion 122 is thicker than the middle portion 121, and protrudes further outwards than the middle portion 121 in the X-axis direction.

The lower flange portion 130 has the same structure as the upper flange portion 120. That is, the lower flange portion 130 includes a middle portion 131 and a second terminal accommodation portion 132 formed on one side of the middle portion 131. As illustrated, the first terminal accommodation portion 122 and the second terminal accommodation portion 132 are spaced apart from each other in the X-axis direction. First terminal pins 123 to 126 are accommodated in the first terminal accommodation portion 122, and second terminal pins 133 to 136 are accommodated in the second terminal accommodation portion 132.

The intermediate legs 213 and 223 of the cores 210 and 220 are inserted into the through-hole 140 formed in the bobbin unit 100. The middle portions 121 and 131 of the flange portions 120 and 130 of the bobbin unit 100 are disposed between the pair of outer legs 211 and 212 of the upper core 210 and between the pair of outer legs 221 and 222 of the lower core 220. In this way, the cores 210 and 220 and the bobbin unit 100 are assembled to each other.

After assembly, the coils wound around the wound portion 110 of the bobbin unit 100 are disposed so as to be aligned with the intermediate legs 213 and 223 of the cores 210 and 220.

Although not illustrated in FIG. 2, the primary coils NP1 and NP2 and the secondary coils NS1, NS2, NS3, and NS4 are wound around the wound portion 110 of the bobbin unit 100 in the Y-axis direction, which is perpendicular to the X-axis direction, about the X-axis. End portions of the secondary coils NS1, NS2, NS3, and NS4 are connected to the first and second terminal pins 123 to 126 and 133 to 136, which are formed on the front surface of the bobbin unit 100 in the Y-axis direction, and end portions of the primary coils extend from the wound portion and are connected to respective terminal pins, which are formed on the rear surface of the bobbin unit 100.

As illustrated in FIG. 2, the first and second terminal pins 123 to 126 and 133 to 136 for the secondary coils are mounted in multiple layers in the bobbin unit 100. Specifically, four first terminal pins 123 to 126 are mounted in the first terminal accommodation portion 122 of the upper flange portion 120, and four second terminal pins 133 to 136 are mounted in the second terminal accommodation portion 132 of the lower flange portion 130.

Based on FIG. 2, the terminal pins 123 to 126 and 133 to 136 are disposed so as not to overlap each other when viewed in the X-axis direction. That is, none of the first terminal pins 123 to 126 of the upper flange portion 120 or the second terminal pins 133 to 136 of the lower flange portion 130 overlap each other in the X-axis direction.

The terminal accommodation portion 122 of the upper flange portion 120 includes a pair of upper and lower surfaces 122b and 122c, which are oriented in the X-axis direction, and a side surface 122a, which interconnects the upper and lower surfaces 122b and 122c, and the terminal accommodation portion 132 of the lower flange portion 130 includes a pair of upper and lower surfaces 132b and 132c, which are oriented in the X-axis direction, and a side surface 132a, which interconnects the upper and lower surfaces 132b and 132c. The terminal pins 123 to 126 and 133 to 136 are mounted on the side surfaces 122a and 132a of the terminal accommodation portions 122 and 132. The terminal pins 123 to 126 and 133 to 136 may be integrally formed with the bobbin unit 100 through insert injection molding, or a separate insulative reinforcement portion may be formed at the bobbin unit 100 or around the coils. The terminal pins 123 to 126 and 133 to 136 may be mounted so as to be exposed to the outside. The insulative reinforcement portion may be made of a polymer-resin-based material, for example, epoxy resin, silicon resin, or the like. However, any of various materials may be used for the insulative reinforcement portion, so long as the same is capable of securing sufficient strength to realize as slim a final product as possible.

The terminal pins 123 to 126 and 133 to 136 are mounted to the bobbin unit in the Y-axis direction, which is perpendicular to the X-axis direction, and then are bent in the X-axis direction, thereby forming the transformer as a final product, as shown in FIG. 5. In detail, as shown in FIG. 5, the terminal pins 123 to 126 and 133 to 136 are bent such that end portions thereof are located at the same mounting height h in the X-axis direction. The end portions of the terminal pins 123 to 126 and 133 to 136 may be located on a printed circuit board, and may be mounted thereon through soldering or the like. Here, the mounting height h is the height at which the end portions of the terminal pins are located so as to be soldered on the printed circuit board. The terminal pins 123 to 126 and 133 to 136 are bent and extend in the X-axis direction beyond the lowermost surface of the transformer by the mounting height h. That is, the mounting height h is the height of each of the end portions, which does not overlap the transformer in the X-axis direction. In this case, among the end portions of the terminal pins, the end portion having the lowest height may be 85% to 99% of the height of the end portion having the highest height.

Hereinafter, connection of the first terminal pins 123 to 126, which are accommodated in the first terminal accommodation portion 122 located in the upper layer, and the second terminal pins 133 to 136, which are accommodated in the second terminal accommodation portion 132 located in the lower layer, to the secondary coils NS1, NS2, NS3, and NS4 will be described with reference to FIGS. 2 and 3. For better understanding, correspondence between the reference numerals of the terminal pins of FIG. 2 and the reference numerals of the pins of FIG. 3 is defined as follows.

| 123: ⑫ | 124: ⑩ | 125: ⑦ | 126: ⑤ |
| 133: ⑪ | 134: ⑨ | 135: ⑧ | 136: ⑥ |

The primary coils NP1 and NP2 include a first primary coil NP1 and a second primary coil NP2. The terminal pins for the primary coils are located on the rear surface of the bobbin unit 100, and thus are not visible in FIG. 2.

According to the embodiment, the secondary coils may form a plurality of turns NS1, NS2, NS3, and NS4. The turns may include a first secondary coil NS1, a second secondary coil NS2, a third secondary coil NS3, and a fourth secondary coil NS4. The terminal pins 123 to 126 and 133 to 136 connected to the turns of the secondary coils may be disposed in the two terminal accommodation portions 122 and 132, as shown in FIG. 2. The first secondary coil NS1 and the second secondary coil NS2 correspond to the first primary coil NP1, and the third secondary coil NS3 and the fourth secondary coil NS4 correspond to the second primary coil NP2.

The first secondary coil NS1 and the second secondary coil NS2 form a pair so as to correspond to the first primary coil NP1, and are logically and electrically connected to each other.

The third secondary coil NS3 and the fourth secondary coil NS4 form a pair so as to correspond to the second primary coil NP2, and are logically and electrically connected to each other.

Here, the logical and electrical connection may be achieved through electrical connection via a circuit pattern formed on the printed circuit board.

The first secondary coil NS1 and the second secondary coil NS2 are logically connected to each other, and thus are electrically connected to each other at the end portions thereof.

For example, each of the coils includes a winding portion, which is wound around the wound portion 110 of the bobbin unit 100, and a pair of a start-side extension portion and a finish-side extension portion, which extend from the winding portion to the terminal pin. Among a pair of secondary coils that are logically and electrically connected to each other, the start-side extension portion of one of the secondary coils and the finish-side extension portion of the other of the secondary coils are electrically connected to each other.

The embodiment will be described on the basis of the first secondary coil NS1 and the second secondary coil NS2 with reference to FIG. 4. Referring to FIG. 4, the finish-side extension portion NS1" of the first secondary coil NS1 and the start-side extension portion NS2' of the second secondary coil NS2 need to be electrically connected to each other, and thus the terminal pins 134 and 135 (pin 9 and pin 8) corresponding thereto may intersect each other, or may be disposed in the same layer.

Although not illustrated, because the third secondary coil NS3 and the fourth secondary coil NS4, which correspond to the second primary coil NP2, are also logically and electrically connected to each other, the finish-side extension portion of the third secondary coil NS3 and the start-side extension portion of the fourth secondary coil NS4 are electrically connected to each other. Therefore, the terminal pin 124 (pin 10) corresponding to the finish-side extension portion of the third secondary coil NS3 and the terminal pin 125 (pin 7) corresponding to the start-side extension portion of the fourth secondary coil NS4 need to be electrically connected to each other, and thus may intersect each other, or may be disposed in the same layer. However, in the embodiment, the finish-side extension portion of the third secondary coil NS3 and the start-side extension portion of the fourth secondary coil NS4 do not intersect each other due to the winding structure.

In the embodiment, as shown in FIG. 2, the terminal pins 133 to 136 for the first and second secondary coils NS1 and NS2 are located in the second terminal accommodation portion 132, and the terminal pins 123 to 126 for the third and fourth secondary coils NS3 and NS4 are located in the first terminal accommodation portion 122.

In the case in which the extension portions of the coils that should not be electrically connected to each other intersect each other when viewed in the X-axis direction, the terminal pins 123 to 126 and 133 to 136 corresponding thereto are disposed in different layers, thereby minimizing or inhibiting the risk of electrical connection between the extension portions of the coils.

Based on FIG. 6, among the end portions of the first terminal pins, bent in the first direction so as not to overlap the bobbin unit in the second direction, and the end portions of the second terminal pins, bent in the first direction so as not to overlap the bobbin unit in the second direction, an end portion having a lowest height is 85% to 99% of a height of an end portion having a highest height.

According to the above-described multi-layer arrangement structure of the terminal pins, extension portions of a plurality of coils are capable of being disposed in a confined space without the risk of interference or a short therebetween. This is consequently very advantageous from the aspect of slimness of a magnetic component.

As is apparent from the above description, according to the present disclosure, manufacturing costs and manufacturing time may be reduced, quality uniformity may be improved, and a slim magnetic component may be obtained.

It will be apparent to those skilled in the art that various changes in form and details may be made without departing from the spirit and essential characteristics of the disclosure set forth herein. Accordingly, the above detailed description is not intended to be construed to limit the disclosure in all aspects and to be considered by way of example. The scope of the disclosure should be determined by reasonable interpretation of the appended claims and all equivalent modifications made without departing from the disclosure should be included in the following claims.

What is claimed is:

1. A magnetic component comprising:
a core unit comprising an upper core and a lower core;
a bobbin unit having at least a portion disposed inside the core unit; and
a coil unit comprising primary coils and secondary coils disposed to be spaced apart from each other on the bobbin unit in a second direction, the second direction being perpendicular to a first direction oriented from the upper core toward the lower core,
wherein the bobbin unit comprises:
a wound portion including an upper flange portion, a lower flange portion spaced apart from the upper flange portion, and a middle flange portion connecting the upper flange portion and the lower flange portion;
a first terminal accommodation portion extending in the second direction from the upper flange portion; and
a second terminal accommodation portion extending in the second direction from the lower flange portion,
wherein one side of the first terminal accommodation portion includes a plurality of first terminal pins bent in the first direction,
wherein one side of the second terminal accommodation portion includes a plurality of second terminal pins bent in the first direction
wherein at least a part of the secondary coils is electrically connected to the plurality of first terminal pins in the second direction through the wound portion,
wherein a last part of the secondary coils is electrically connected to the plurality of second terminal pins in the second direction through the wound portion, and
wherein the bobbin unit includes an insulative reinforcement portion exposing the plurality of first terminal pins and the plurality of second terminal pins.

2. The magnetic component according to claim 1, wherein the secondary coils comprise a first turn and a second turn, wherein each of the first turn and the second turn comprises a winding portion wound around the bobbin unit and two extension portions extending from the winding portion toward the first and second terminal pins,
wherein one of the extension portions of the first turn and one of the extension portions of the second turn are electrically connected to each other, and
wherein the one of the extension portions of the first turn and the one of the extension portions of the second turn, electrically connected to each other, are disposed in the first terminal accommodation portion.

3. The magnetic component according to claim 2, wherein a remaining one of the extension portions of the first turn and a remaining one of the extension portions of the second turn are electrically separated from each other, and
wherein the remaining one of the extension portions of the first turn and the remaining one of the extension portions of the second turn, electrically separated from each other, are respectively disposed in the first terminal accommodation portion and the second terminal accommodation portion.

4. The magnetic component according to claim 3, wherein the primary coils are connected to the first or second plurality of terminal pins formed on another side opposite the one side of the bobbin unit.

5. The magnetic component according to claim 4, wherein the primary coils comprise a first primary coil and a second primary coil, and
wherein the secondary coils comprise:
a first secondary coil corresponding to the first primary coil;
a second secondary coil electrically connected to the first secondary coil;
a third secondary coil corresponding to the second primary coil; and
a fourth secondary coil electrically connected to the third secondary coil.

6. The magnetic component according to claim 5, wherein the first secondary coil is electrically connected at a finish-side extension portion thereof to a start-side extension portion of the second secondary coil, and
wherein the third secondary coil is electrically connected at a finish-side extension portion thereof to a start-side extension portion of the fourth secondary coil.

7. The magnetic component according to claim 5, wherein the first or second terminal pins for the first secondary coil and the second secondary coil are disposed in the second terminal accommodation portion, and
wherein the first or second terminal pins for the third secondary coil and the fourth secondary coil are disposed in the first terminal accommodation portion.

8. The magnetic component according to claim 1, wherein the first terminal accommodation portion and the second terminal accommodation portion are disposed in parallel to each other in the first direction.

9. The magnetic component according to claim 1, wherein, among end portions of the first terminal pins, bent in the first direction so as not to overlap the bobbin unit in the second direction, and end portions of the second terminal pins, bent in the first direction so as not to overlap the bobbin unit in the second direction, an end portion having a lowest height is 85% to 99% of a height of an end portion having a highest height.

10. The magnetic component according to claim 1, wherein the insulative reinforcement portion comprises at least one of epoxy resin and silicon resin.

11. The magnetic component according to claim 1, wherein a thickness of the first terminal accommodation portion in the first direction is greater than a thickness of the upper flange portion in the first direction, and
wherein a thickness of the second terminal accommodation portion in the first direction is greater than a thickness of the lower flange portion in the first direction.

12. The magnetic component according to claim 11, wherein an uppermost surface of the first terminal accommodation portion is higher than an uppermost surface of the upper flange portion, and
wherein a lowermost surface of the second terminal accommodation portion is lower than a lowermost surface of the upper flange portion.

13. The magnetic component according to claim 11, wherein a width of the first terminal accommodating part in a third direction crossing the first direction and the second direction is greater than a width of the upper flange portion in the third direction, and
wherein a width of the second terminal accommodating part in the third direction is greater than a width of the upper flange portion in the third direction.

14. The magnetic component according to claim 13, wherein the first direction and the second direction are orthogonal to each other, and
wherein the second direction and the third direction are orthogonal to each other.

15. The magnetic component according to claim 1, wherein the upper flange portion, the lower flange portion, the middle flange portion, the first terminal accommodation portion, and the second terminal accommodation portion are integrally formed.

16. The magnetic component according to claim 11, wherein the first terminal pins and the second terminal pins are disposed so as not to overlap each other in the first direction.

\* \* \* \* \*